United States Patent
Yanaka et al.

(10) Patent No.: US 11,292,233 B2
(45) Date of Patent: Apr. 5, 2022

(54) LAMINATED SHEET AND ELECTRONIC COMPONENT PACKAGING CONTAINER MOLDED USING SAME

(71) Applicant: DENKA COMPANY LIMITED, Tokyo (JP)

(72) Inventors: Ryosuke Yanaka, Isesaki (JP); Yusuke Masuda, Isesaki (JP)

(73) Assignee: DENKA COMPANY LIMITED, Tokyo (JP)

( * ) Notice: Subject to any disclaimer, the term of this patent is extended or adjusted under 35 U.S.C. 154(b) by 157 days.

(21) Appl. No.: 16/954,340

(22) PCT Filed: Jan. 23, 2019

(86) PCT No.: PCT/JP2019/002050
§ 371 (c)(1),
(2) Date: Jun. 16, 2020

(87) PCT Pub. No.: WO2019/146630
PCT Pub. Date: Aug. 1, 2019

(65) Prior Publication Data
US 2021/0162721 A1    Jun. 3, 2021

(30) Foreign Application Priority Data
Jan. 24, 2018    (JP) .............................. JP2018-009769

(51) Int. Cl.
| | |
|---|---|
| B32B 25/04 | (2006.01) |
| C08F 220/14 | (2006.01) |
| C08F 212/08 | (2006.01) |
| C08F 236/06 | (2006.01) |
| B32B 25/16 | (2006.01) |
| B65D 65/40 | (2006.01) |
| H01L 21/683 | (2006.01) |
| H05K 13/00 | (2006.01) |

(52) U.S. Cl.
CPC .......... *B32B 25/042* (2013.01); *B32B 25/16* (2013.01); *B65D 65/40* (2013.01); *C08F 212/08* (2013.01); *C08F 220/14* (2013.01); *C08F 236/06* (2013.01); *H01L 21/6836* (2013.01); *H05K 13/0084* (2013.01); *B32B 2270/00* (2013.01); *B32B 2307/418* (2013.01); *B32B 2307/51* (2013.01); *B32B 2439/02* (2013.01)

(58) Field of Classification Search
CPC ............ B32B 2270/00; B32B 2307/51; B32B 2439/02; B32B 25/042; B32B 25/16; B32B 27/308; B32B 2250/03; B32B 2250/24; B32B 2307/418; B32B 2307/54; B32B 2307/546; B32B 2307/718; B32B 2307/732; B32B 2405/00; B32B 2553/00; B32B 27/08; B32B 27/302; B32B 27/36; B32B 7/023; B65D 65/40; B65D 2585/86; B65D 75/327; B65D 75/34; B65D 85/38; B65D 85/671; C09D 125/06; C09D 151/04; C08L 53/02; C08L 25/06; C08F 212/08; C08F 220/14; C08F 236/06; H01L 21/56; H01L 21/6836; H01L 23/293; H01L 23/31; H05K 13/0084

See application file for complete search history.

(56) References Cited

U.S. PATENT DOCUMENTS

| | | | | |
|---|---|---|---|---|
| 6,433,081 | B1 * | 8/2002 | Tokunaga | ............... B32B 27/36 525/63 |
| 2005/0124739 | A1 | 6/2005 | Oda et al. | |
| 2013/0295307 | A1 * | 11/2013 | Fujiwara | ................. B32B 27/08 428/36.4 |

FOREIGN PATENT DOCUMENTS

| | | |
|---|---|---|
| JP | 08-244179 A | 9/1996 |
| JP | 2002-113818 A | 4/2002 |
| JP | 2002-332392 A | 11/2002 |
| JP | 2003-055526 A | 2/2003 |
| JP | 2003-253069 A | 9/2003 |
| JP | 2004-042360 A | 2/2004 |
| JP | 2005-238614 A | 9/2005 |
| JP | 2006-281452 A | 10/2006 |
| JP | 2010-214607 A | 9/2010 |
| JP | 2011-042072 A | 3/2011 |
| WO | 2012/102287 A1 | 8/2012 |

OTHER PUBLICATIONS

Apr. 9, 2019 Search Report issued in International Patent Application No. PCT/JP2019/002050.

* cited by examiner

*Primary Examiner* — Yan Lan
(74) *Attorney, Agent, or Firm* — Oliff PLC

(57) ABSTRACT

A laminated sheet with a cover material, an adhesive cover tape, and an electronic component packaging container molded. A laminated sheet having a surface layer on both sides of a substrate layer, and the substrate layer includes 30 to 70 mass % of a component mentioned below, 70 to 30 mass % of a component mentioned below, and 0 to 30 mass % of a recycled material of the laminated sheet to the total mass of the substrate layer. The component is a rubber modified (meth)acrylic acid ester-vinyl aromatic hydrocarbon copolymer having a conjugated diene rubber component content of 5 to 15 mass %. The component is a vinyl aromatic hydrocarbon-conjugated diene block copolymer containing 15 to 30 mass % of monomeric units derived from conjugated dienes. The component is at least one polymer selected from the group consisting of a vinyl aromatic hydrocarbon polymer and a rubber modified vinyl aromatic hydrocarbon polymer.

10 Claims, No Drawings

LAMINATED SHEET AND ELECTRONIC COMPONENT PACKAGING CONTAINER MOLDED USING SAME

TECHNICAL FIELD

The present invention relates to a laminated sheet and an electronic component packaging container molded by using the same, more specifically a carrier tape or a tray.

BACKGROUND ART

As carrier tapes for mounting electronic components such as ICs or LSIs on electronic devices, sheets composed of thermoplastic resins, such as vinyl chloride resins, vinyl aromatic hydrocarbon-based resins, polycarbonate-based resins, and polyethylene terephthalate-based resins, thermoformed into an embossed shape are used. For these kinds of carrier tapes, for example, opaque sheets that are made conductive by containing conductive fillers such as carbon black in the thermoplastic resin are used in order to prevent electrostatic damage to the electronic components housed in the embossed portions (also called "pockets"). Meanwhile, for carrier tapes that store objects such as capacitors that are less likely to be destroyed by electrostatic damage among the electronic components, transparent type carrier tapes, in which thermoplastic resins having a relatively good transparency among the resins mentioned above are as substrates, are used due to advantages in the visual inspection of the stored electronic components from outside or detection of the characters written on the electronic components.

As sheets for transparent type carrier tapes, for example, a sheet in which a vinyl aromatic hydrocarbon polymer and a vinyl aromatic hydrocarbon-conjugated diene block copolymer are mixed (see Patent Documents 1 and 2), a sheet in which a rubber modified (meth)acrylic acid ester-vinyl aromatic hydrocarbon copolymer is used (Patent Document 3), and the like have been proposed.

Since the carrier tapes using these sheets have transparency, the electronic components housed inside can be visually inspected from outside and the characters written on the electronic components can be detected. Therefore, the applications of the carrier tapes have expanded in recent years.

However, the sheets in which a vinyl aromatic hydrocarbon polymer and a vinyl aromatic hydrocarbon-conjugated diene block copolymer are mixed do not have a good sealing property with acrylic adhesive cover tapes which are cover material for carrier tapes, and large peel strength differences after sealing have become a problem. Moreover, with the sheets using rubber modified (meth)acrylic acid ester-vinyl aromatic hydrocarbon copolymers, when a pocket with a relatively large drawing ratio is to be molded during thermoforming of the carrier tape or the like, the total thickness of the pocket becomes notably thin, and makes it difficult to obtain pockets having sufficient strength. Therefore, there has been a need for a sheet having an even better moldability, in which the total thickness of the pocket does not become notably thin even when the pocket is molded with a relatively large drawing ratio.

CITATION LIST

Patent Literature

Patent Document 1: JP 2003-055526 A
Patent Document 2: JP 2002-332392 A
Patent Document 3: JP 2003-253069 A

SUMMARY OF INVENTION

Technical Problem

The present invention addresses the problems of providing a laminated sheet for use in an electronic component packaging container, more specifically a carrier tape or tray, and an electronic component packaging container molded using the laminated sheet, the laminated sheet having a good moldability and a good sealing property especially with an adhesive cover tape, which is a cover material.

Solution to Problem

As a result of diligently studying these problems, the present inventors discovered that a laminated sheet that solves all of the aforementioned problems can be obtained by providing a laminated sheet having surface layers formed from a rubber modified (meth)acrylic acid ester-vinyl aromatic hydrocarbon copolymer, in which the content of a conjugated diene component is within a specific range, on both sides of a substrate layer containing, in a specific ratio, a vinyl aromatic hydrocarbon-conjugated diene block copolymer, in which the content of monomeric units derived from conjugated dienes is within a specific range, and at least one polymer selected from the group consisting of a vinyl aromatic hydrocarbon polymer and a rubber modified vinyl aromatic hydrocarbon polymer, thereby arriving at the present invention.

That is, the present invention is a laminated sheet having surface layers on both sides of a substrate layer, wherein the surface layer comprises an (A) component mentioned below, and the substrate layer comprises 30 to 70 mass % of a (B) component mentioned below, 70 to 30 mass % of a (C) component mentioned below, and 0 to 30 mass % of a recycled material of the laminated sheet with respect to the total mass of the substrate layer.

The (A) component is a rubber modified (meth)acrylic acid ester-vinyl aromatic hydrocarbon copolymer having a conjugated diene rubber component content of 5 to 15 mass %. The (B) component is a vinyl aromatic hydrocarbon-conjugated diene block copolymer containing 15 to 30 mass % of monomeric units derived from conjugated dienes. The (C) component is at least one polymer selected from the group consisting of a vinyl aromatic hydrocarbon polymer and a rubber modified vinyl aromatic hydrocarbon polymer.

Preferably, the weight-average molecular weight (Mw) of the (A) component is 110,000 to 170,000, the weight-average molecular weight (Mw) of the (B) component is 80,000 to 220,000, and the weight-average molecular weight (Mw) of the (C) component is 150,000 to 400,000.

The tensile elastic modulus of the laminated sheet of the present invention measured by an evaluation method in accordance with JIS-K-7127 is preferably 1,000 to 2,500 MPa, and the folding endurance of the laminated sheet measured by an evaluation method in accordance with JIS-P-8115 is preferably 30 times or more.

Moreover, the total light transmittance of the laminated sheet of the present invention measured by an evaluation method in accordance with JIS-K-7105 is preferably 80 to 100% and the refractive index difference between the surface layers and the substrate layer is preferably 0 to 0.05.

Furthermore, the present invention includes an electronic component packaging container using the laminated sheet of the present invention and more specifically, a carrier tape or a tray for transporting electronic components. The present invention further includes an electronic component package using these electronic component packaging containers.

Effects of Invention

The present invention can provide a laminated sheet having a good moldability and a good sealing property especially with an adhesive cover tape, which is a cover material, and an electronic component packaging container molded using the laminated sheet, more specifically a carrier tape or a tray.

DESCRIPTION OF EMBODIMENTS

The present invention shall be explained in detail below.

The rubber modified (meth)acrylic acid ester-vinyl aromatic hydrocarbon copolymer ((A) component) contained in the surface layers of the laminated sheet of the present invention can be obtained by copolymerizing (meth)acrylic acid ester-based monomers and vinyl aromatic hydrocarbon-based monomers in the presence of a rubber component. Within a resin phase comprising a copolymer of the (meth)acrylic acid ester-based monomers and vinyl aromatic hydrocarbon-based monomers, the rubber component graft polymerized with the (meth)acrylic acid ester-based monomers and vinyl aromatic hydrocarbon-based monomers is dispersed in the form of islands. As the rubber component, for example, a conjugated diene-based rubber containing 1,3-butadiene (butadiene), 2-methyl-1,3-butadiene (isoprene), 2,3-dimethyl-1,3-butadiene, 1,3-pentadiene, 1,3-hexadiene, 2-methylpentadiene, or the like as a monomer is used, and among them, butadiene and isoprene are preferable. One or more types of such conjugated diene-based monomers can be used. (Meth)acrylic acid ester-based monomers are derivatives of acrylic acid esters and methacrylic acid esters, and include, for example, methyl methacrylate, ethyl methacrylate, methyl acrylate, ethyl acrylate, n-butyl acrylate, 2-methylhexyl acrylate, 2-ethylhexyl acrylate, and the like. The (meth)acrylic acid ester monomers can be used alone or as a combination of two or more types thereof. Moreover, a vinyl aromatic hydrocarbon-based monomer is styrene or a derivative thereof. Examples of the derivatives can include α-methylstyrene, p-methylstyrene, o-methylstyrene, p-t-butylstyrene, and the like. Preferably, the monomer is styrene. The vinyl aromatic hydrocarbon-based monomers can be used alone or as a combination of two or more types thereof. The rubber modified (meth)acrylic acid ester-vinyl aromatic hydrocarbon copolymers can be manufactured using a conventionally known polymerization method such as emulsion polymerization or solution polymerization.

In terms of the balance between the strength, moldability, transparency, etc. of the laminated sheet of the present invention, the content of the conjugated diene rubber component included in the rubber modified (meth)acrylic acid ester-vinyl aromatic hydrocarbon copolymer included in the surface layer is 5 to 15 mass %, preferably 7 to 13 mass % with respect to the total mass of the rubber modified (meth)acrylic acid ester-vinyl aromatic hydrocarbon copolymer. The content of the conjugated diene rubber component within the rubber modified (meth)acrylic acid ester-vinyl aromatic hydrocarbon copolymer can be adjusted by a conventionally known method during the production stage of the rubber modified (meth)acrylic acid ester-vinyl aromatic hydrocarbon copolymer. Moreover, commercially available rubber modified (meth)acrylic acid ester-vinyl aromatic hydrocarbon copolymers containing conjugated diene rubber components within the range mentioned above can be used as-is. In the present invention, one or more types of rubber modified (meth)acrylic acid ester-vinyl aromatic hydrocarbon copolymers containing conjugated diene rubber components within the range mentioned above can be used.

In one aspect of the present invention, the surface layer preferably contains only the (A) component. In addition, the surface layers on both sides of the substrate layer both preferably contain only the (A) component.

Since the laminated sheet of the present invention comprises such surface layers, when it is used, for example, as a carrier tape, the variation in peel strength (difference between the maximum value and the minimum value of the peel strength) with respect to not only heat seal cover tapes but also adhesive cover tapes, which serve as cover materials, can be minimized, resulting in a stable seal property.

The vinyl aromatic hydrocarbon-conjugated diene block copolymer ((B) component) contained in the substrate layer of the laminated sheet of the present invention is a polymer that contains, in the structure thereof, a block mainly composed of vinyl aromatic hydrocarbon-based monomers and a block mainly composed of conjugated diene-based monomers. Examples of the vinyl aromatic hydrocarbon-based monomers include styrene, o-methylstyrene, p-methylstyrene, p-t-butylstyrene, 1,3-dimethyl styrene, α-methylstyrene, vinylnaphthalene, vinylanthracene, 1,1-diphenylethylene, and the like, and among them, styrene is preferable. One or more types of vinyl aromatic hydrocarbon-based monomers can be used. Examples of the conjugated diene-based monomers include 1,3-butadiene (butadiene), 2-methyl-1,3-butadiene (isoprene), 2,3-dimethyl-1,3-butadiene, 1,3-pentadiene, 1,3-hexadiene, 2-methylpentadiene, and the like, and among them, butadiene and isoprene are preferable. One or more types of conjugated diene-based monomers can be used. The block mainly composed of vinyl aromatic hydrocarbon-based monomers refers to either a block composed only of a structure derived from vinyl aromatic hydrocarbon-based monomers or a block that contains 50 mass % or more of a structure derived from vinyl aromatic hydrocarbon-based monomers. The block mainly composed of conjugated diene-based monomers refers to either a block composed only of a structure derived from conjugated diene-based monomers or a block that contains 50 mass % or more of a structure derived from conjugated diene-based monomers. The vinyl aromatic hydrocarbon-conjugated diene block copolymer can be produced by a conventionally known polymerization method such as emulsion polymerization or solution polymerization.

In terms of the balance between the strength, moldability, etc. of the laminated sheet of the present invention, the content of monomeric units derived from conjugated dienes in the vinyl aromatic hydrocarbon-conjugated diene block copolymer contained in the substrate layer is 15 to 30 mass %, preferably 20 to 25 mass % with respect to the total mass of the vinyl aromatic hydrocarbon-conjugated diene block copolymer. The content of monomeric units derived from conjugated dienes within the vinyl aromatic hydrocarbon-conjugated diene block copolymer can be adjusted by a conventionally known method during the production stage of the vinyl aromatic hydrocarbon-conjugated diene block copolymer. Moreover, commercially available vinyl aromatic hydrocarbon-conjugated diene block copolymers containing monomeric units derived from conjugated dienes within the range mentioned above can be used as-is. In the present invention, one or more types of vinyl aromatic hydrocarbon-conjugated diene block copolymers containing monomeric units derived from conjugated dienes within the range mentioned above can be used.

Although the so-called general-purpose polystyrene (GPPS), which is a homopolymer of styrene, is the most common vinyl aromatic hydrocarbon polymer for the (C) component contained in the substrate layer of the laminated sheet of the present invention, it may contain one or more aromatic vinyl monomers such as o-methyl styrene, p-methyl styrene, p-tert-butyl styrene, 1,3-dimethyl styrene, α-methylstyrene, vinylnaphthalene, vinylanthracene, and 1,1-diphenylethylene as trace components.

Although the so-called high impact polystyrene (HIPS), which is obtained by polymerizing styrene monomers in the presence of a rubber components and in which the rubber component graft polymerized with the styrene monomers is dispersed in the form of islands within a resin phase comprising polystyrene, is the most common rubber modified vinyl aromatic hydrocarbon polymer for the (C) component, it may contain one or more aromatic vinyl monomers such as o-methylstyrene, p-methylstyrene, p-tert-butyl styrene, 1,3-dimethyl styrene, α-methylstyrene, vinylnaphthalene, vinylanthracene, and 1,1-diphenylethylene as trace components. As the rubber component, for example, a conjugated diene-based rubber containing 1,3-butadiene (butadiene), 2-methyl-1,3-butadiene (isoprene), 2,3-dimethyl-1,3-butadiene, 1,3-pentadiene, 1,3-hexadiene, 2-methylpentadiene, or the like as a monomer is used, and among them, butadiene and isoprene are preferable. One or more types of such conjugated diene-based monomers can be used. The vinyl aromatic hydrocarbon polymer and the rubber modified vinyl aromatic hydrocarbon polymers can be used by mixing them.

In one aspect of the present invention, the (C) component contained in the substrate layer preferably contains at least a vinyl aromatic hydrocarbon polymer and preferably contains both a vinyl aromatic hydrocarbon polymer and a rubber modified vinyl aromatic hydrocarbon polymer. When the (C) component contains both a vinyl aromatic hydrocarbon polymer and a rubber modified vinyl aromatic hydrocarbon polymer, the content of the vinyl aromatic hydrocarbon polymer is preferably 60 to 80 mass % with respect to the total mass of the (C) component.

The substrate layer contains 30 to 70 mass %, preferably 35 to 60 mass % of the vinyl aromatic hydrocarbon-conjugated diene block copolymer ((B) component) with respect to the total mass of the substrate layer. A content lower than this range will reduce the folding endurance of the laminated sheet of the present invention and a content higher than this range will reduce the tensile elastic modulus thereof. Moreover, the substrate layer contains 70 to 30 mass %, preferably 60 to 35 mass % of at least one polymer ((C) component) selected from the group consisting of the vinyl aromatic hydrocarbon polymer and rubber modified vinyl aromatic hydrocarbon polymer with respect to the total mass of the substrate layer. A content lower than this range will reduce the tensile elastic modulus of the laminated sheet of the present invention and a content higher than this range will reduce the folding endurance thereof.

Furthermore, the substrate layer can contain 0 to 30 mass % of recycled material with respect to the total mass of the substrate layer. The recycled material is material obtained when producing laminated sheets with extrusion molding by pulverization and re-pelleting of parts called "ears", which are generated by trimming the opposite ends of the sheet extruded by the die, and parts that cannot be used directly as a product, such as the beginning portion when winding the sheet. The recycled material is commonly reused by adding to the substrate layer raw material. Even if the recycled material is added in this way, it is extremely important that the laminated sheet has good properties in terms of productivity of the laminated sheet. If the recycled material contained in the substrate layer of the laminated sheet of the present invention exceeds 30 mass %, transparency decreases.

In one aspect of the present invention, a material derived from the laminated sheet of the present invention can be used as the recycled material. In other words, a recycled raw material obtained by pulverizing and re-pelleting of the laminated sheet that includes the substrate layer and the surface layers of the present invention can be contained in the substrate layer of the present invention.

The (A) component (rubber modified (meth)acrylic acid ester-vinyl aromatic hydrocarbon copolymer) contained in the surface layers of the laminated sheet of the present invention, the (B) component (vinyl aromatic hydrocarbon-conjugated diene block copolymers) and the (C) component (at least one polymer selected from the group consisting of a vinyl aromatic hydrocarbon polymer and a rubber modified vinyl aromatic hydrocarbon polymer) contained in the substrate layer preferably have weight-average molecular weight (Mw) in the ranges mentioned below.

(A) component: Mw=110,000-170,000
(B) component: Mw=80,000-220,000
(C) component: Mw=150,000-400,000

By using resins with weight-average molecular weight (Mw) within the above ranges respectively, a laminated sheet having good transparency, moldability, and folding resistance can be easily obtained.

Moreover, the weight-average molecular weight (Mw) of each component refers to a value obtained through standard polystyrene conversion by using gel permeation chromatography (GPC).

The laminated sheet preferably has a tensile elastic modulus in the sheet flow direction in a range of 1000 to 2500 MPa. The flow direction herein refers to the direction in which the laminated sheet is produced (MD direction) during creation thereof. If the tensile elastic modulus is lower than this range, the rigidity required of pockets when molded into a carrier tape is more likely to be reduced, and it is less likely to obtain a good molded article. If the tensile elastic modulus is higher than this range, the laminated sheet becomes fragile, and the folding endurance is more likely to be reduced.

The folding endurance of the laminated sheet is preferably 30 times or more. If the folding endurance is less than 30 times, the laminated sheet is more likely to break.

The total light transmittance of the laminated sheet is preferably in a range of 80 to 100%. If the total light transmittance is less than 80%, the transparency of the laminated sheet is more likely to deteriorate. Thus, when it is used as a carrier tape, the components stored in the pockets may become less visible. In order to obtain a laminated sheet with good transparency, the refractive index difference between the surface layer and the substrate layer is preferably 0 to 0.05.

Note that the refractive index difference refers to a difference between the refractive indexes of the layers obtained by measuring with an evaluation method in accordance with JIS-K-7142.

In one aspect of the present invention, haze value of the laminated sheet measured by an evaluation method in accordance with JIS-K-7105 is preferably less than 50.

The method of producing the laminated sheet of the present invention is not specifically limited and the laminated sheet can be manufactured by a common method. For example, the sheet can be suitably manufactured by extrusion molding using a multi-layer T-die with a multi-manifold or by T-die extrusion molding using a feed block.

Although the total thickness of the laminated sheet of the present invention and the thickness of the surface layer are not specifically limited, the total thickness is typically 100 to 700 µm, and the thickness of the surface layer is preferably in the range of 3 to 20% of the total thickness.

By using a known sheet molding method (thermoforming) such as vacuum forming, pressure forming, or press forming, a free-form electronic component packaging container such as a carrier tape or a tray can be obtained from the laminated sheet of the present invention. In particular, it is extremely useful for manufacturing a transparent type carrier tape that is good in all aspects of transparency, folding endurance, and impact strength.

An electronic component packaging container stores electronic component and as an electronic component package, is used to store and transport electronic components. For example, carrier tapes are used in the storage and transportation of electronic components as carrier tape bodies, in which the carrier tape, after having housed electronic components in pockets formed by the molding method mentioned above, is covered with a cover tape and then wound into a reel shape.

Electronic components packaged in electronic component packages are for example, but not specifically limited to, ICs, LEDs (light emitting diodes), resistors, liquid crystals, capacitors, transistors, piezoelectric element registers, filters, crystal oscillators, crystal resonators, diodes, connectors, switches, volumes, relays, inductors, and the like. It may also be intermediate or final products that use these electronic components.

Other aspects of the present invention are as follows:

[1] A laminated sheet composed of a substrate layer and surface layers provided on both sides of the substrate layer, wherein the surface layer comprises an (A) component mentioned below, the substrate layer comprises 30 to 70 mass % of a (B) component mentioned below, 30 to 70 mass % of a (C) component mentioned below, and 0 to 30 mass % of a recycled material of the laminated sheet with respect to the total mass of the substrate layer, wherein the total content of the (B) component, the (C) component, and the recycled material in the substrate layer does not exceed 100 mass %.

The (A) component is a rubber modified (meth)acrylic acid ester-vinyl aromatic hydrocarbon copolymer having a conjugated diene rubber component content of 5 to 15 mass %. The (B) component is a vinyl aromatic hydrocarbon-conjugated diene block copolymer containing 15 to 30 mass % of monomeric units derived from conjugated dienes. The (C) component is at least one polymer selected from the group consisting of a vinyl aromatic hydrocarbon polymer and a rubber modified vinyl aromatic hydrocarbon polymer.

[2] The laminated sheet described in [1], wherein the conjugated diene rubber component in the (A) component is a rubber component obtained from at least one conjugated diene selected from the group consisting of butadiene and isoprene.

[3] The laminated sheet described in [1] or [2], wherein the conjugated diene in the (B) component is at least one conjugated diene selected from the group consisting of butadiene and isoprene.

[4] The laminated sheet described in any one of [1] to [3], wherein the (C) component contains at least a vinyl aromatic hydrocarbon polymer.

[5] The laminated sheet described in any one of [1] to [4], wherein the (A) component has a weight-average molecular weight (Mw) of 110,000 to 170,000, the (B) component has a weight-average molecular weight (Mw) of 80,000 to 220,000, and the (C) component has a weight-average molecular weight (Mw) of 150,000 to 400,000.

EXAMPLES

[Raw Material Resin]

The raw material resins shown in Table 1 were adjusted and prepared by known methods in order to be used in the examples and the comparative examples.

TABLE 1

| | Raw Material Resin | Weight-average molecular weight (Mw) × 10000 | Conjugated diene ratio |
|---|---|---|---|
| (A) | MBS1 | 15 | 2% |
| | MBS2 | 13 | 7% |
| | MBS3 | 12 | 13% |
| | MBS4 | 10 | 20% |
| (B) | SBC1 | 24 | 12% |
| | SBC2 | 12 | 17% |
| | SBC3 | 14 | 20% |
| | SBC4 | 22 | 27% |
| | SBC5 | 11 | 35% |
| | SBC6 | 9 | 60% |
| (C) | PS1 | 33 | — |
| | PS2 | 18 | — |
| | PS3 | 17 | 9% |

MBS1-4: Methyl methacrylate-butadiene-styrene copolymers
SBC1-6: Styrene-butadiene block copolymer
PS1-2: General-purpose polystyrene (GPPS)
PS3: High-impact polystyrene (HIPS)

Here, the content of the conjugated diene rubber component in MBS1 to 4, which are rubber modified (meth)acrylic acid ester-vinyl aromatic hydrocarbon copolymers ((A) components), and PS3, which is a rubber modified vinyl aromatic hydrocarbon polymer ((C) component), as well as the content of monomeric units derived from conjugated dienes of SBC1 to 6, which are vinyl aromatic hydrocarbon-conjugated diene block copolymers ((B) components), were calculated from the IR spectrum of each raw material resin obtained by Fourier Transform Infrared Spectroscopy (FT-IR) manufactured by JASCO Corporation.

In addition, the weight-average molecular weight (Mw) of each raw material resin was calculated with a molecular weight distribution curve of standard polystyrene conversion obtained in usual manner by using gel permeation chromatography (GPC). Moreover, prior to GPC measurement, the raw material resin was dispersed in tetrahydrofuran and agitated at 23° C. for 24 hours, and then a syringe filter (WHATMAN GD/X—filter diameter: 25 mm; membrane filter material: PTFE, pore size: 0.45 µm) was used to remove insoluble matter to produce samples for GPC measurement. GPC measurements were conducted under the following conditions.

Column temperature: 40° C.
Detection method: Differential refraction method
Mobile phase: Tetrahydrofuran
Sample concentration: 0.2 mass %
Calibration curve: Created using standard polystyrene (made by Polymer Laboratories)

[Evaluation Method]
Sheets produced in the examples and comparative examples were each evaluated using the following methods.
(1) Transparency Evaluation
In accordance with JIS-K-7105, the haze value and the total light transmittance were measured using a haze meter.
(2) Tensile Elastic Modulus Evaluation
In accordance with JIS-K-7127, measurements were made with type 5 test pieces sampled with the sheet flow direction as the longitudinal direction, using Strograph VE-1D manufactured by Toyo Seiki Seisaku-sho, Ltd.
(3) Folding Endurance Evaluation
In accordance with JIS-P-8115 (2001), test pieces with a length of 150 mm, a width of 15 mm, and a thickness of 0.3 mm were made by sampling, with the sheet flow direction as the longitudinal direction, and MIT folding endurance was measured using an MIT folding endurance tester manufactured by Toyo Seiki Seisaku-sho, Ltd. The tests here were performed with a folding angle of 135°, a folding speed of 175 folds per minute, and a measurement load of 250 g.
(4) Moldability Evaluation
At a heater temperature condition of 210° C., a pressure forming machine was used to mold a 24 mm-wide carrier tape. The pocket size of the carrier tape was 15 mm in the flow direction, 11 mm in the width direction, and 5 mm in the depth direction. The bottom and sides of the pocket of this carrier tape were each cut out and a moldability evaluation was performed by measuring the thickness, using a profile measurement laser microscope manufactured by KEYENCE CORPORATION. When the difference in the sheet thickness between the bottom and the sides of the pocket was +/−10% or more and 20% or less, it was noted as "acceptable", when it was less than +/−10%, it was noted as "good", and when it was more than +/−20%, it was noted as "poor."
(5) Peel Strength Evaluation
Using PT-2012 manufactured by BOLIAN, a 13 mm-wide adhesive cover tape (adhesive cover tape manufactured by RUITAI) was sealed against a 24 mm-wide sheet sample with a sealing pressure of 0.4 MPa. Meanwhile, NK600 manufactured by NAGATA SEIKI CO., LTD. was used to heat seal a 21.5 mm-wide heat seal cover tape (ALS-TB100 manufactured by Denka Company Limited) against a 24 mm-wide sheet sample with a sealing time of 0.3 sec, a feed pitch of 12 mm (2 seals), and a sealing pressure of 0.5 MPa, with the temperature of the hot iron adjusted so that the average peeling strength would be 0.4 N when peeling at a peeling angle of 180°. For each test body, a VG-35 peel tester manufactured by Vanguard Systems INC. was used to peel 100 mm of the cover tape at a peeling angle of 180° and a peeling speed of 600 mm per minute to determine the difference between the maximum and minimum values of the peel strength.

(6) Layer Thickness Accuracy
When the difference between the target thickness and the actually measured thickness of the surface layers and the substrate layer of the sheet at the time of film forming of the sheet was +/−10% or more and 20% or less, it was noted as "acceptable", when it was less than +/−10%, it was noted as "good", and when it was more than +/−20%, it was noted as "poor." The thickness was measured at the opposite ends and the center of the cross-section in a direction (TD direction) that is orthogonal to the sheet flow direction.
(7) Refractive Index
The refractive index was measured in accordance with JIS-K-7142 for the raw material resins or the uniform mixtures of the raw material resins used in the surface layers and the substrate layer in each example and comparative example to determine the refractive indexes of the surface layers and the substrate layer. Moreover, the difference between them was used as the refractive index difference between the surface layers and the substrate layer.

Examples 1 to 12

The raw material resins used for the surface layers and the substrate layer and the mixing ratio thereof are shown in Table 2. By means of a feed block method using a φ45 mm extruder (L/D=26) for the surface layer, a φ65 mm extruder (L/D=28) for the substrate layer, and a 500 mm-wide T-die, a laminated sheet having an overall thickness (total thickness) of 0.3 mm, in which the thickness ratio of the surface layer, the substrate layer, and the surface layer was 7:86:7 (the target thickness of the surface layer was 21 μm and the target thickness of the substrate layer was 258 μm), was obtained.

Comparative Examples 1 to 3 and 8 to 12

The raw material resins used for the surface layers and substrate layers and the mixing ratio thereof are shown in Table 3. A laminated sheet was obtained as in Example 1.

Comparative Examples 4 to 7

The raw material resins and the mixing ratio thereof are shown in Table 3. By means of a feed block method using a φ65 mm extruder (L/D=28) and a 500 mm-wide T-die, a single layer sheet having a total thickness of 0.3 mm was obtained. In addition, in Comparative Example 5, a sheet could not be obtained since the sheet broke during film forming.

The evaluation results of the sheets produced in the examples and comparison examples are shown together in Tables 2 and 3.

TABLE 2

|  |  | Examples | | | | | | |
|---|---|---|---|---|---|---|---|---|
|  |  | 1 | 2 | 3 | 4 | 5 | 6 | 7 |
| Surface | MBS1 | 0 | 0 | 0 | 0 | 0 | 0 | 0 |
| layer | MBS2 | 100 | 100 | 100 | 100 | 100 | 100 | 100 |
| (mass %) | MBS3 | 0 | 0 | 0 | 0 | 0 | 0 | 0 |
|  | MBS4 | 0 | 0 | 0 | 0 | 0 | 0 | 0 |
| Substrate | SBC1 | 0 | 0 | 0 | 0 | 0 | 0 | 0 |
| layer | SBC2 | 0 | 0 | 0 | 0 | 0 | 0 | 0 |
| (mass %) | SBC3 | 30 | 50 | 43 | 38 | 50 | 50 | 38 |

TABLE 2-continued

|  |  |  |  |  |  |  |  |  |
|---|---|---|---|---|---|---|---|---|
|  | SBC4 | 0 | 0 | 0 | 0 | 0 | 0 | 0 |
|  | SBC5 | 0 | 0 | 0 | 0 | 0 | 0 | 0 |
|  | SBC6 | 0 | 0 | 0 | 0 | 0 | 0 | 0 |
|  | PS1 | 70 | 50 | 43 | 38 | 40 | 30 | 23 |
|  | PS2 | 0 | 0 | 0 | 0 | 0 | 0 | 0 |
|  | PS3 | 0 | 0 | 0 | 0 | 10 | 20 | 15 |
|  | Recycled material | 0 | 0 | 14 | 24 | 0 | 0 | 24 |
| Evaluation | Haze (%) | 16.0 | 17.0 | 20.0 | 35.0 | 25.0 | 30.0 | 45.0 |
|  | Total light transmittance (%) | 90.0 | 90.0 | 90.0 | 90.0 | 90.0 | 90.0 | 90.0 |
|  | Tensile elastic modulus (MPa) | 2000 | 1500 | 1500 | 1500 | 1400 | 1500 | 1500 |
|  | Folding endurance (times) | 40 | 200 | 200 | 200 | 500 | 700 | 700 |
|  | Moldability | Acceptable | Good | Good | Good | Good | Good | Good |
|  | Difference between maximum and minimum values of peel strength with adhesive cover tape (N) | 0.1 | 0.1 | 0.1 | 0.1 | 0.1 | 0.1 | 0.1 |
|  | Difference between maximum value and minimum values of peel strength with cover tape (N) | 0.1 | 0.1 | 0.1 | 0.1 | 0.1 | 0.1 | 0.1 |
|  | Layer thickness accuracy | Acceptable | Good | Good | Good | Good | Good | Good |
|  | Refractive index of surface layer | 1.549 | 1.549 | 1.549 | 1.549 | 1.549 | 1.549 | 1.549 |
|  | Refractive index of substrate layer | 1.59 | 1.587 | 1.586 | 1.586 | 1.587 | 1.588 | 1.589 |
|  | Refractive index difference between surface layer and substrate layer | 0.041 | 0.038 | 0.037 | 0.037 | 0.038 | 0.039 | 0.040 |

|  |  |  | Examples |  |  |  |  |
|---|---|---|---|---|---|---|---|
|  |  |  | 8 | 9 | 10 | 11 | 12 |
| Surface layer (mass %) | MBS1 |  | 0 | 0 | 0 | 0 | 0 |
|  | MBS2 |  | 100 | 100 | 100 | 100 | 0 |
|  | MBS3 |  | 0 | 0 | 0 | 0 | 100 |
|  | MBS4 |  | 0 | 0 | 0 | 0 | 0 |
| Substrate layer (mass %) | SBC1 |  | 0 | 0 | 0 | 0 | 0 |
|  | SBC2 |  | 0 | 0 | 50 | 0 | 0 |
|  | SBC3 |  | 50 | 70 | 0 | 0 | 50 |
|  | SBC4 |  | 0 | 0 | 0 | 50 | 0 |
|  | SBC5 |  | 0 | 0 | 0 | 0 | 0 |
|  | SBC6 |  | 0 | 0 | 0 | 0 | 0 |
|  | PS1 |  | 0 | 30 | 50 | 50 | 50 |
|  | PS2 |  | 50 | 0 | 0 | 0 | 0 |
|  | PS3 |  | 0 | 0 | 0 | 0 | 0 |
|  | Recycled material |  | 0 | 0 | 0 | 0 | 0 |
| Evaluation | Haze (%) |  | 18.0 | 19.0 | 17.0 | 17.0 | 17.0 |
|  | Total light transmittance (%) |  | 90.0 | 90.0 | 90.0 | 90.0 | 90.0 |
|  | Tensile elastic modulus (MPa) |  | 1500 | 1000 | 1600 | 1300 | 1300 |
|  | Folding endurance (times) |  | 200 | >1000 | 80 | 600 | 400 |
|  | Moldability |  | Good | Acceptable | Good | Acceptable | Acceptable |
|  | Difference between maximum and minimum values of peel strength with adhesive cover tape (N) |  | 0.1 | 0.1 | 0.1 | 0.1 | 0.1 |
|  | Difference between maximum value and minimum values of peel strength with cover tape (N) |  | 0.1 | 0.1 | 0.1 | 0.1 | 0.1 |
|  | Layer thickness accuracy |  | Acceptable | Acceptable | Good | Acceptable | Acceptable |
|  | Refractive index of surface layer |  | 1.549 | 1.549 | 1.549 | 1.549 | 1.549 |
|  | Refractive index of substrate layer |  | 1.587 | 1.584 | 1.588 | 1.585 | 1.587 |

TABLE 2-continued

|  |  |  |  |  |  |
|---|---|---|---|---|---|
| Refractive index difference between surface layer and substrate layer | 0.038 | 0.035 | 0.039 | 0.036 | 0.038 |

TABLE 3

|  |  | Comparative Example |  |  |  |  |  |  |
|---|---|---|---|---|---|---|---|---|
|  |  | 1 | 2 | 3 | 4 | 5 | 6 | 7 |
| Surface layer (mass %) | MBS1 | 0 | 0 | 0 | — | — | 0 | — |
|  | MBS2 | 100 | 100 | 100 | — | — | 100 | — |
|  | MBS3 | 0 | 0 | 0 | — | — | 0 | — |
|  | MBS4 | 0 | 0 | 0 | — | — | 0 | — |
| Substrate layer (mass %) | SBC1 | 0 | 0 | 0 | 0 | 0 | — | 0 |
|  | SBC2 | 0 | 0 | 0 | 0 | 0 | — | 0 |
|  | SBC3 | 20 | 80 | 34 | 100 | 0 | — | 50 |
|  | SBC4 | 0 | 0 | 0 | 0 | 0 | — | 0 |
|  | SBC5 | 0 | 0 | 0 | 0 | 0 | — | 0 |
|  | SBC6 | 0 | 0 | 0 | 0 | 0 | — | 0 |
|  | PS1 | 80 | 20 | 34 | 0 | 100 | — | 50 |
|  | PS2 | 0 | 0 | 0 | 0 | 0 | — | 0 |
|  | PS3 | 0 | 0 | 0 | 0 | 0 | — | 0 |
|  | Recycled material | 0 | 0 | 32 | 0 | 0 | — | 0 |
| Evaluation | Haze (%) | 15.0 | 20.0 | 60.0 | 22.0 | — | 10.0 | 17.0 |
|  | Total light transmittance (%) | 90.0 | 90.0 | 90.0 | 90.0 | — | 90.0 | 90.0 |
|  | Tensile elastic modulus (MPa) | 2200 | 900 | 1500 | 700 | — | 1600 | 1400 |
|  | Folding endurance (times) | 1 | >1000 | 200 | >1000 | — | 20 | 220 |
|  | Moldability | Good | Poor | Good | Poor | — | Acceptable | Good |
|  | Difference between maximum and minimum values of peel strength with adhesive cover tape (N) | 0.1 | 0.1 | 0.1 | 0.5 | — | 0.1 | 0.5 |
|  | Difference between maximum and minimum values of peel strength with cover tape (N) | 0.1 | 0.1 | 0.1 | 0.1 | — | 0.1 | 0.1 |
|  | Layer thickness accuracy | Poor | Poor | Good | — | Film formation impossible | — | — |
|  | Refractive index of surface layer | 1.549 | 1.549 | 1.549 | — | — | 1.549 | — |
|  | Refractive index of substrate layer | 1.592 | 1.583 | 1.585 | 1.580 | 1.595 | — | 1.585 |
|  | Refractive index difference between surface layer and substrate layer | 0.043 | 0.034 | 0.036 | — | — | — | — |

|  |  | Comparative Example |  |  |  |  |
|---|---|---|---|---|---|---|
|  |  | 8 | 9 | 10 | 11 | 12 |
| Surface layer (mass %) | MBS1 | 0 | 0 | 0 | 100 | 0 |
|  | MBS2 | 100 | 100 | 100 | 0 | 0 |
|  | MBS3 | 0 | 0 | 0 | 0 | 0 |
|  | MBS4 | 0 | 0 | 0 | 0 | 100 |
| Substrate layer (mass %) | SBC1 | 50 | 0 | 0 | 0 | 0 |
|  | SBC2 | 0 | 0 | 0 | 0 | 0 |
|  | SBC3 | 0 | 0 | 0 | 50 | 50 |
|  | SBC4 | 0 | 0 | 0 | 0 | 0 |
|  | SBC5 | 0 | 50 | 0 | 0 | 0 |
|  | SBC6 | 0 | 0 | 50 | 0 | 0 |
|  | PS1 | 50 | 50 | 50 | 50 | 50 |
|  | PS2 | 0 | 0 | 0 | 0 | 0 |
|  | PS3 | 0 | 0 | 0 | 0 | 0 |
|  | Recycled material | 0 | 0 | 0 | 0 | 0 |
| Evaluation | Haze (%) | 17.0 | 17.0 | 17.0 | 15.0 | 20.0 |
|  | Total light transmittance (%) | 90.0 | 90.0 | 90.0 | 90.0 | 90.0 |

TABLE 3-continued

|  |  |  |  |  |  |
|---|---|---|---|---|---|
| Tensile elastic modulus (MPa) | 1700 | 1000 | 700 | 1600 | 900 |
| Folding endurance (times) | 20 | >1000 | >1000 | 20 | 700 |
| Moldability | Good | Poor | Poor | Acceptable | Poor |
| Difference between maximum and minimum values of peel strength with adhesive cover tape (N) | 0.1 | 0.1 | 0.1 | 0.1 | 0.1 |
| Difference between maximum and minimum values of peel strength with cover tape (N) | 0.1 | 0.1 | 0.1 | 0.1 | 0.1 |
| Layer thickness accuracy | Good | Poor | Poor | Acceptable | Acceptable |
| Refractive index of surface layer | 1.549 | 1.549 | 1.549 | 1.549 | 1.549 |
| Refractive index of substrate layer | 1.590 | 1.582 | 1.572 | 1.586 | 1.586 |
| Refractive index difference between surface layer and substrate layer | 0.041 | 0.033 | 0.023 | 0.037 | 0.037 |

As shown in Table 2, the laminated sheets of the examples had sufficient transparency and strength, and good thickness accuracy in the surface layers and the substrate layers resulted in good moldability. Thus, due to the good sealing property not only with a heat seal cover tape but also with an adhesive cover tape, it was confirmed that the laminated sheets are suitable for use as carrier tapes.

The invention claimed is:

1. A laminated sheet having a surface layer on both sides of a substrate layer, wherein the surface layer comprises an (A) component, and the substrate layer comprises 30 to 70 mass % of a (B) component, 70 to 30 mass % of a (C) component, and 0 to 30 mass % of a recycled material of the laminated sheet with respect to a total mass of the substrate layer,
    wherein the (A) component is a rubber modified (meth) acrylic acid ester-vinyl aromatic hydrocarbon copolymer having a conjugated diene rubber component content of 5 to 15 mass %,
    the (B) component is a vinyl aromatic hydrocarbon-conjugated diene block copolymer containing 15 to 30 mass % of monomeric units derived from conjugated dienes, and
    the (C) component is at least one polymer selected from the group consisting of a vinyl aromatic hydrocarbon polymer and a rubber modified vinyl aromatic hydrocarbon polymer.

2. The laminated sheet according to claim 1, wherein the (A) component has a weight-average molecular weight (Mw) of 110,000 to 170,000, the (B) component has a weight-average molecular weight (Mw) of 80,000 to 220,000, and the (C) component has a weight-average molecular weight (Mw) of 150,000 to 400,000.

3. The laminated sheet according to claim 1, wherein the laminated sheet has a tensile elastic modulus of 1,000 to 2,500 MPa as measured by an evaluation method in accordance with JIS-K-7127.

4. The laminated sheet according to claim 1, wherein the laminated sheet has a folding endurance of 30 times or more as measured by an evaluation method in accordance with JIS-P-8115.

5. The laminated sheet according to claim 1, wherein the laminated sheet has a total light transmittance of 80 to 100% as measured by an evaluation method in accordance with JIS-K-7105.

6. The laminated sheet according to claim 1, wherein the laminated sheet has a refractive index difference of 0 to 0.05 between the surface layer and the substrate layer.

7. An electronic component packaging container using the laminated sheet according to claim 1.

8. The electronic component packaging container according to claim 7, wherein the electronic component packaging container is a carrier tape.

9. The electronic component packaging container according to claim 7, wherein the electronic component packaging container is a tray.

10. An electronic component package using the electronic component packaging container according to claim 7.

* * * * *